(12) United States Patent
Cao et al.

(10) Patent No.: US 11,002,852 B2
(45) Date of Patent: May 11, 2021

(54) LIDAR DETECTOR WITH HIGH TIME RESOLUTION

(71) Applicant: Shenzhen Genorivision Technology Co., Ltd., Shenzhen (CN)

(72) Inventors: Peiyan Cao, Shenzhen (CN); Yurun Liu, Shenzhen (CN)

(73) Assignee: SHENZHEN GENORIVISION TECHNOLOGY CO., LTD., Shenzhen (CN)

(\*) Notice: Subject to any disclaimer, the term of this patent is extended or adjusted under 35 U.S.C. 154(b) by 0 days.

(21) Appl. No.: 16/857,653

(22) Filed: Apr. 24, 2020

(65) Prior Publication Data

US 2020/0256992 A1    Aug. 13, 2020

Related U.S. Application Data

(63) Continuation of application No. PCT/CN2017/108241, filed on Oct. 30, 2017.

(51) Int. Cl.
| | |
|---|---|
| *G01C 3/08* | (2006.01) |
| *G01S 17/08* | (2006.01) |
| *G01S 7/481* | (2006.01) |
| *G01S 7/484* | (2006.01) |
| *G01S 7/4865* | (2020.01) |

(52) U.S. Cl.
CPC .......... *G01S 17/08* (2013.01); *G01S 7/484* (2013.01); *G01S 7/4816* (2013.01); *G01S 7/4865* (2013.01)

(58) Field of Classification Search
CPC ...... G01S 7/4816; G01S 7/484; G01S 7/4865; G01S 7/08; G01S 17/08

USPC ......................................................... 356/5.01
See application file for complete search history.

(56) References Cited

U.S. PATENT DOCUMENTS

| | | | | |
|---|---|---|---|---|
| 4,223,267 A * | 9/1980 | Sartorius | ................ | G01R 29/02 |
| | | | | 368/118 |
| 8,253,896 B2 * | 8/2012 | Yoon | ................... | H01L 27/1446 |
| | | | | 349/108 |
| 2008/0033673 A1 * | 2/2008 | Anton | ...................... | G01T 1/28 |
| | | | | 702/70 |
| 2011/0193133 A1 * | 8/2011 | Ogura | ................. | H01L 31/1105 |
| | | | | 257/184 |
| 2014/0354302 A1 * | 12/2014 | Lu | ....................... | G01R 27/2605 |
| | | | | 324/658 |
| 2016/0365463 A1 * | 12/2016 | Lee | ......................... | H01L 31/09 |
| 2017/0176578 A1 * | 6/2017 | Rae | ......................... | G01S 17/88 |

(Continued)

FOREIGN PATENT DOCUMENTS

| | | |
|---|---|---|
| CN | 105974460 A | 9/2016 |
| TW | 201711083 A | 3/2017 |

(Continued)

OTHER PUBLICATIONS

PCT/CN2017/108241 ISA210 dated Jun. 28, 2018.
PCT/CN2017/108241 ISA237 dated Jun. 28, 2018.

*Primary Examiner* — Mark Hellner
(74) *Attorney, Agent, or Firm* — IPro, PLLC; Qian Gu

(57) ABSTRACT

Disclosed herein is a method and apparatus for determining time of arrival of incident photons. The time of arrival may be determined with high time accuracy based on the times a voltage across a capacitor being charged by charge carriers generated from the incident photons at which the voltage reaches a plurality of thresholds, respectively, and the stable value of the voltage.

18 Claims, 14 Drawing Sheets

(56) References Cited

U.S. PATENT DOCUMENTS

2017/0269237 A1* 9/2017 Cao .................. H01L 27/14609
2017/0309663 A1* 10/2017 Rothman .......... H01L 31/02966

FOREIGN PATENT DOCUMENTS

| WO | 2016161542 A1 | 10/2016 |
| WO | 2016161543 A1 | 10/2016 |
| WO | 2016197338 A1 | 12/2016 |
| WO | 2017045108 A1 | 3/2017 |

* cited by examiner

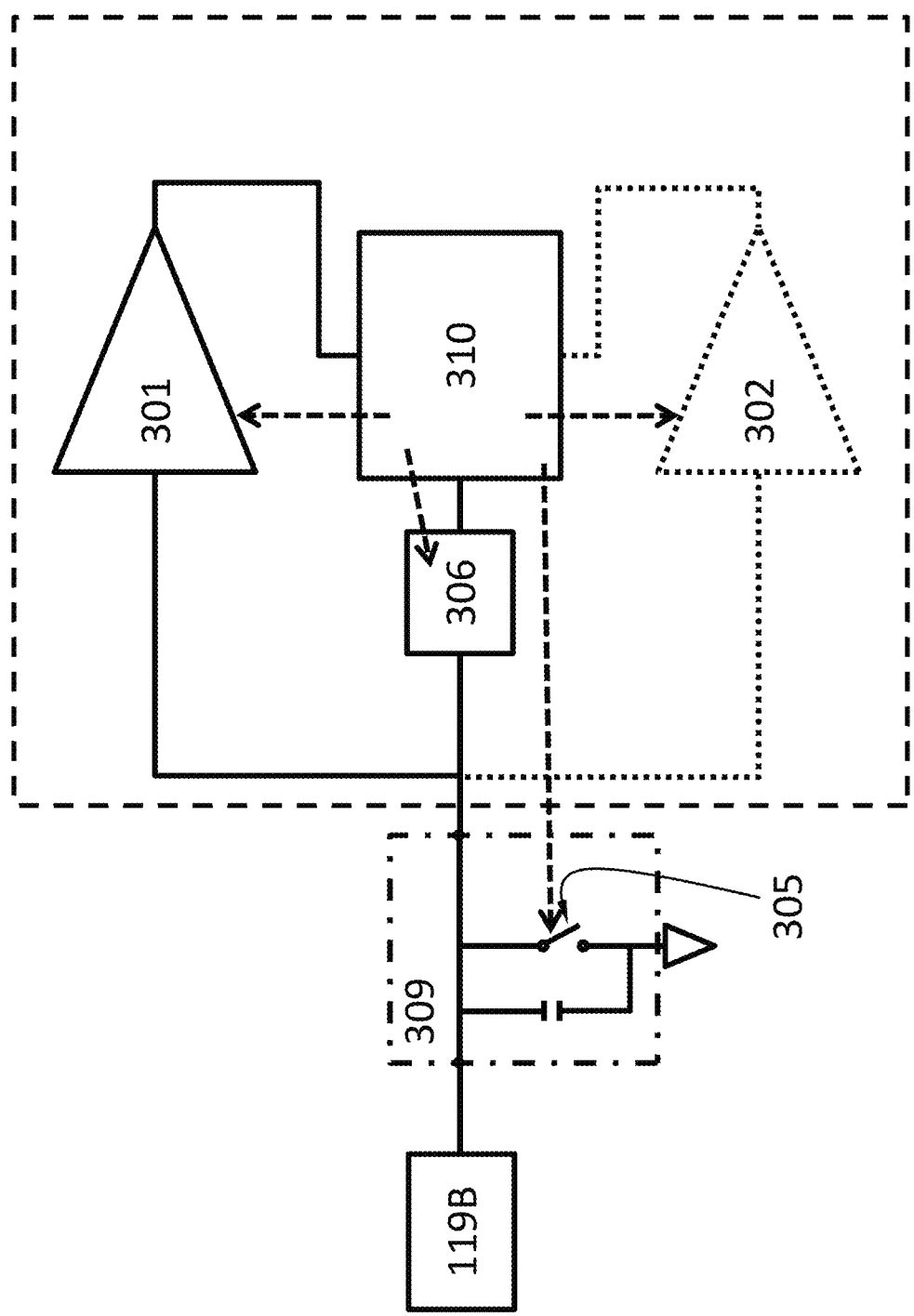

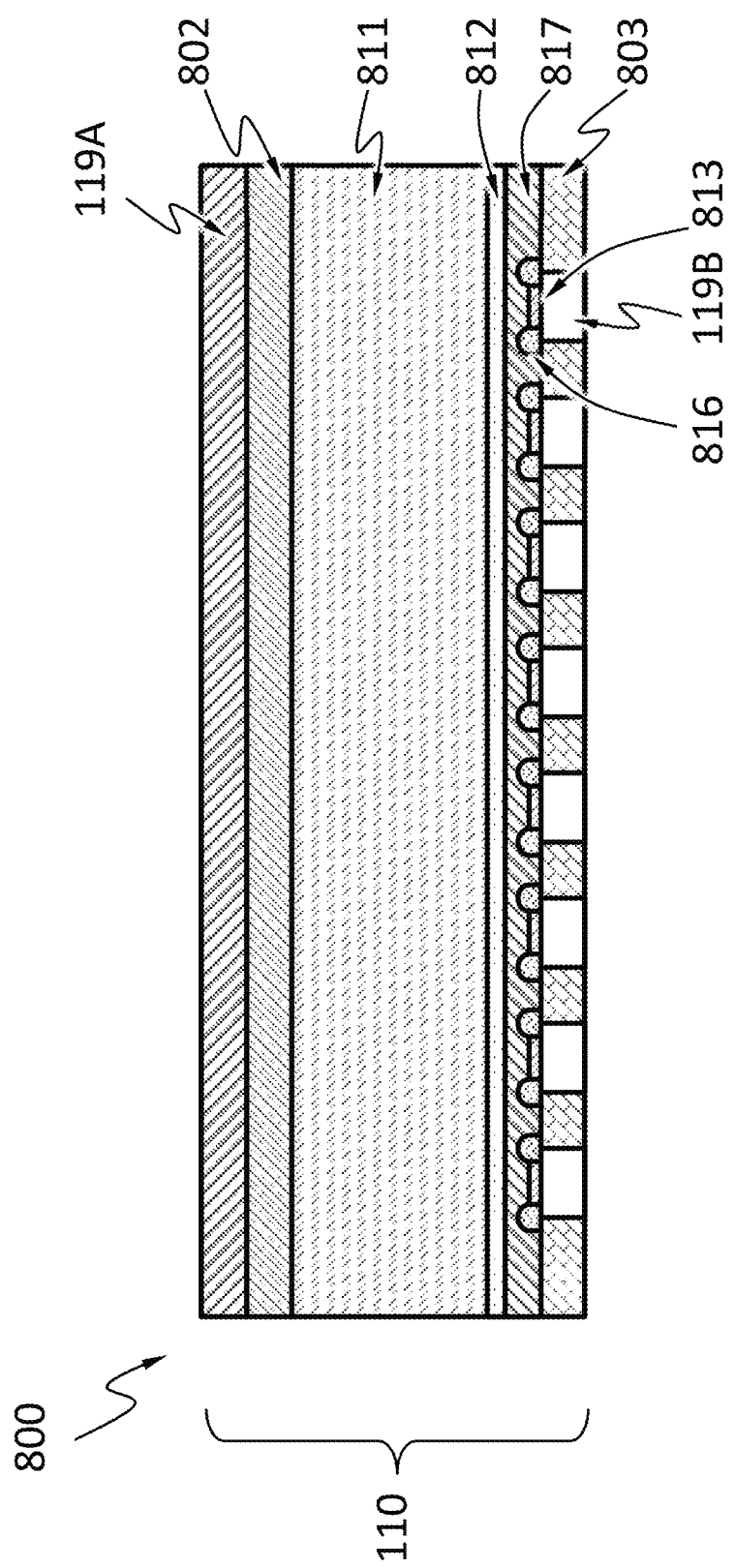

LIDAR DETECTOR WITH HIGH TIME RESOLUTION

TECHNICAL FIELD

The disclosure herein relates to LIDAR detectors, particularly relates to a LIDAR detector with high time resolution.

BACKGROUND

Light Detection and Ranging (LIDAR) is a method of object detection, range finding and mapping. LIDAR uses a technology analogous to radar. There are several major components to a LIDAR system: a light source (e.g., laser), optics, a photon detector and electronics for signal processing. For example, by controlled steering of scanning laser beams, and processing the light reflected from distant objects (e.g., buildings and landscapes), distances and shapes of these objects may be obtained.

One application of LIDAR is in autonomous vehicles (e.g., driverless cars). A LIDAR system in an autonomous vehicle ("on-vehicle LIDAR") may be used for obstacle detection and collision avoidance, which helps the vehicle to navigate safely through environments. An on-vehicle LIDAR may be mounted on the roof of an autonomous vehicle and light beams from the LIDAR system rotate constantly to monitor the environment around the vehicle. The LIDAR system provides the necessary data for determining where potential obstacles exist in the environment, for identifying the spatial structure of obstacles, for distinguishing obstacles, and for estimating the impact of driving over obstacles. One advantage of the LIDAR system compared to radar is that the LIDAR system can provide more accurate ranging and cover a larger field of view.

SUMMARY

Disclosed herein is a method comprising: receiving photons using a photon detector comprising a capacitor; charging the capacitor with charge carriers generated from the photons; obtaining a first time at which an absolute value of a voltage across the capacitor equals or exceeds an absolute value of a first threshold; upon determining that the absolute value of the voltage across the capacitor equals or exceeds an absolute value of a second threshold before expiration of a time delay from the first time, obtaining a second time at which the absolute value of the voltage across the capacitor equals or exceeds the absolute value of the second threshold; obtaining a third time at which the absolute value of the voltage across the capacitor equals or exceeds an absolute value of a third threshold; obtaining a stable value of the voltage across the capacitor when the voltage across the capacitor is stable; determining a time at which the photons arrive at the photon detector, based on the third time, the third threshold and the stable value of the voltage across the capacitor.

According to an embodiment, the method further comprises resetting the voltage across the capacitor after obtaining the stable value of the voltage across the capacitor.

According to an embodiment, the method further comprises: upon determining that the absolute value of the voltage across the capacitor is less than the absolute value of the second threshold after expiration of the time delay, resetting the voltage across the capacitor.

According to an embodiment, the method further comprises emitting a light pulse.

According to an embodiment, the method further comprises allowing the capacitor to be charged upon emitting the light pulse.

According to an embodiment, the photons received by the photon detector are of the light pulse reflected by an object.

According to an embodiment, the method further comprises determining a distance of the object to the photon detector based on the time at which the photons arrive at the photon detector.

Disclosed herein is a photon detector, comprising: a photon absorption layer comprising an electrode, the photon absorption layer configured to receive photons and to generate charge carriers from the photons; a capacitor electrically connected to the electrode and configured to be charged by the charge carriers; a controller; wherein the controller is configured: to obtain a first time at which an absolute value of a voltage across the capacitor equals or exceeds an absolute value of a first threshold; upon determining that the absolute value of the voltage across the capacitor equals or exceeds an absolute value of a second threshold before expiration of a time delay from the first time, to obtain a second time at which the absolute value of the voltage across the capacitor equals or exceeds the absolute value of the second threshold; to obtain a third time at which the absolute value of the voltage across the capacitor equals or exceeds an absolute value of a third threshold; to obtain a stable value of the voltage across the capacitor when the voltage across the capacitor is stable; and to determine a time at which the photons arrive at the photon detector, based on the third time, the third threshold and the stable value of the voltage across the capacitor.

According to an embodiment, the controller is configured to reset the voltage across the capacitor after obtaining the stable value of the voltage across the capacitor.

According to an embodiment, the controller is configured to reset the voltage across the capacitor upon determining that the absolute value of the voltage across the capacitor is less than the absolute value of the second threshold after expiration of the time delay.

According to an embodiment, the photon absorption layer comprises a diode.

According to an embodiment, the photon absorption layer comprises a resistor.

According to an embodiment, the photon absorption layer comprises an amplification region comprising a junction with an electric field in the junction; wherein the electric field is at a sufficient strength to cause an avalanche of charge carriers in the amplification region.

According to an embodiment, the photon absorption layer comprises silicon, germanium, GaAs, CdTe, CdZnTe, or a combination thereof.

According to an embodiment, the photon detector further comprises a voltmeter configured to measure the stable value of the voltage across the capacitor.

According to an embodiment, the photon detector further comprises an array of pixels.

According to an embodiment, the photons are reflected by an object toward the photon detector, wherein the controller is configured to determine a distance of the object to the photon detector based on the time at which the photons arrive at the photon detector.

Disclosed herein is a LIDAR system comprising any of the photon detectors above and a light source configured to emit a light pulse.

BRIEF DESCRIPTION OF FIGURES

FIG. 3A and FIG. 3B each show a component diagram of an electronic system of the photon detector in FIG. 2B of FIG. 2C, according to an embodiment.

FIG. 8D shows a variant of the image sensor of FIG. 8A.

DETAILED DESCRIPTION

Figure 1:
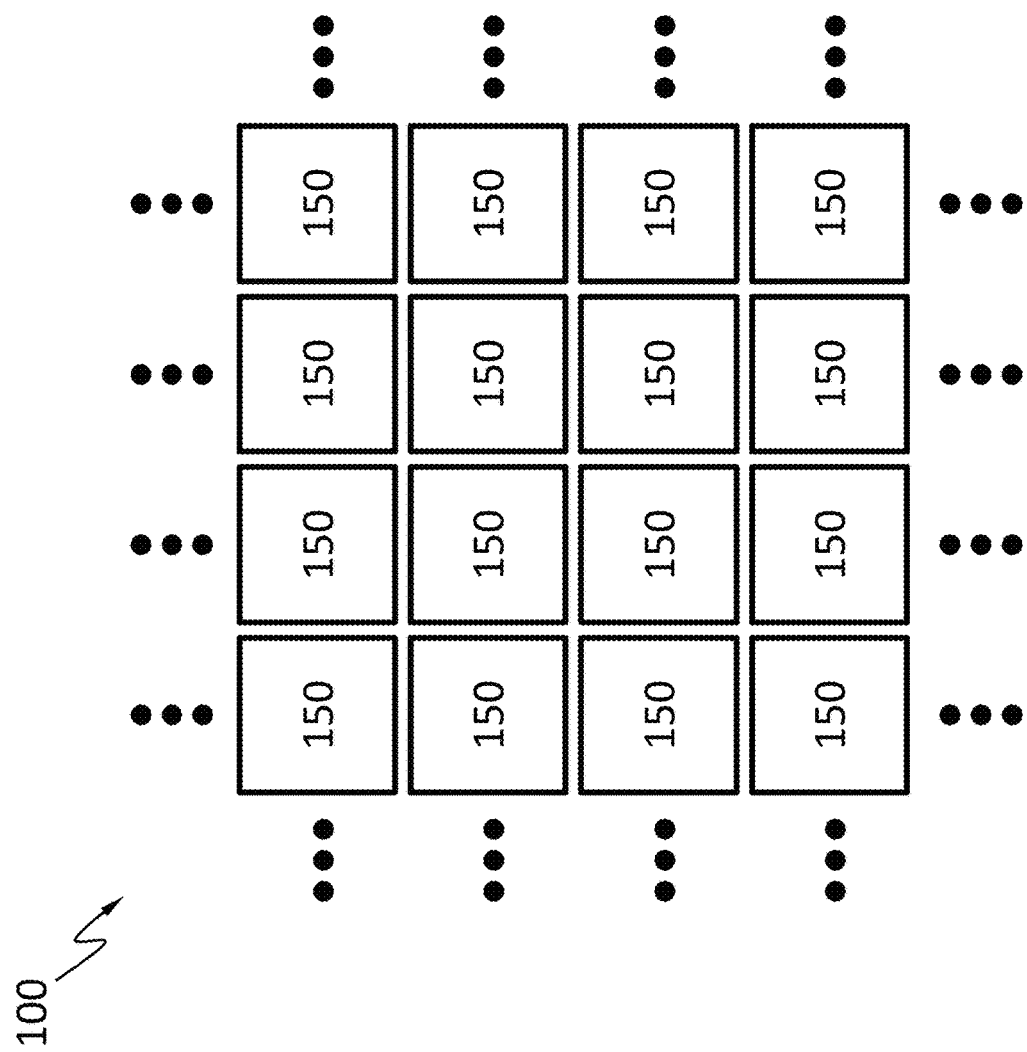
FIG. 1 schematically shows a photon detector, according to an embodiment.

FIG. 1 schematically shows a photon detector 100, as an example, which may be part of a LIDAR system. The photon detector 100 has an array of pixels 150. The array may be a rectangular array, a honeycomb array, a hexagonal array or any other suitable array. Each pixel 150 is configured to detect photons (e.g., photons reflected back from a scene and incident thereon), and may be configured to measure a characteristic (e.g., the energy, the wavelength, and the frequency) of the photons. For example, each pixel 150 is configured to count numbers of photons incident thereon whose energy falls in a plurality of bins, within a period of time. All the pixels 150 may be configured to count the numbers of photons incident thereon within a plurality of bins of energy within the same period of time. In one embodiment, where the incident photons may belong to a reflected light pulse and have the same energy, the pixels 150 may be configured to count the numbers of photons incident thereon within a period of time, without measuring the energy of the individual photons. Each pixel 150 may have its own analog-to-digital converter (ADC) configured to digitize an analog signal representing the energy of an incident photon into a digital signal, or to digitize an analog signal representing the total energy of a plurality of incident photons into a digital signal. The pixels 150 may be configured to operate in parallel. The pixels 150 are not necessarily synchronized. For example, when one pixel 150 measures an incident photon, another pixel 150 may be waiting for a photon to arrive. The pixels 150 may be individually addressable.

Figure 2A:
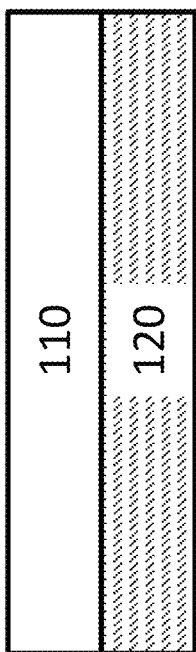
FIG. 2A schematically shows a cross-sectional view of the photon detector, according to an embodiment.
Figure 2A:
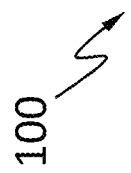

FIG. 2A schematically shows a cross-sectional view of the photon detector 100, according to an embodiment. The photon detector 100 may include a photon absorption layer 110 and an electronics layer 120 (e.g., an ASIC) for processing or analyzing electrical signals incident photon generates in the photon absorption layer 110. The photon detector 100 may or may not include a scintillator. The photon absorption layer 110 may include a semiconductor material such as, silicon, germanium, GaAs, CdTe, CdZnTe, or a combination thereof. The semiconductor may have a high mass attenuation coefficient for the photon of interest.

Figure 2B:
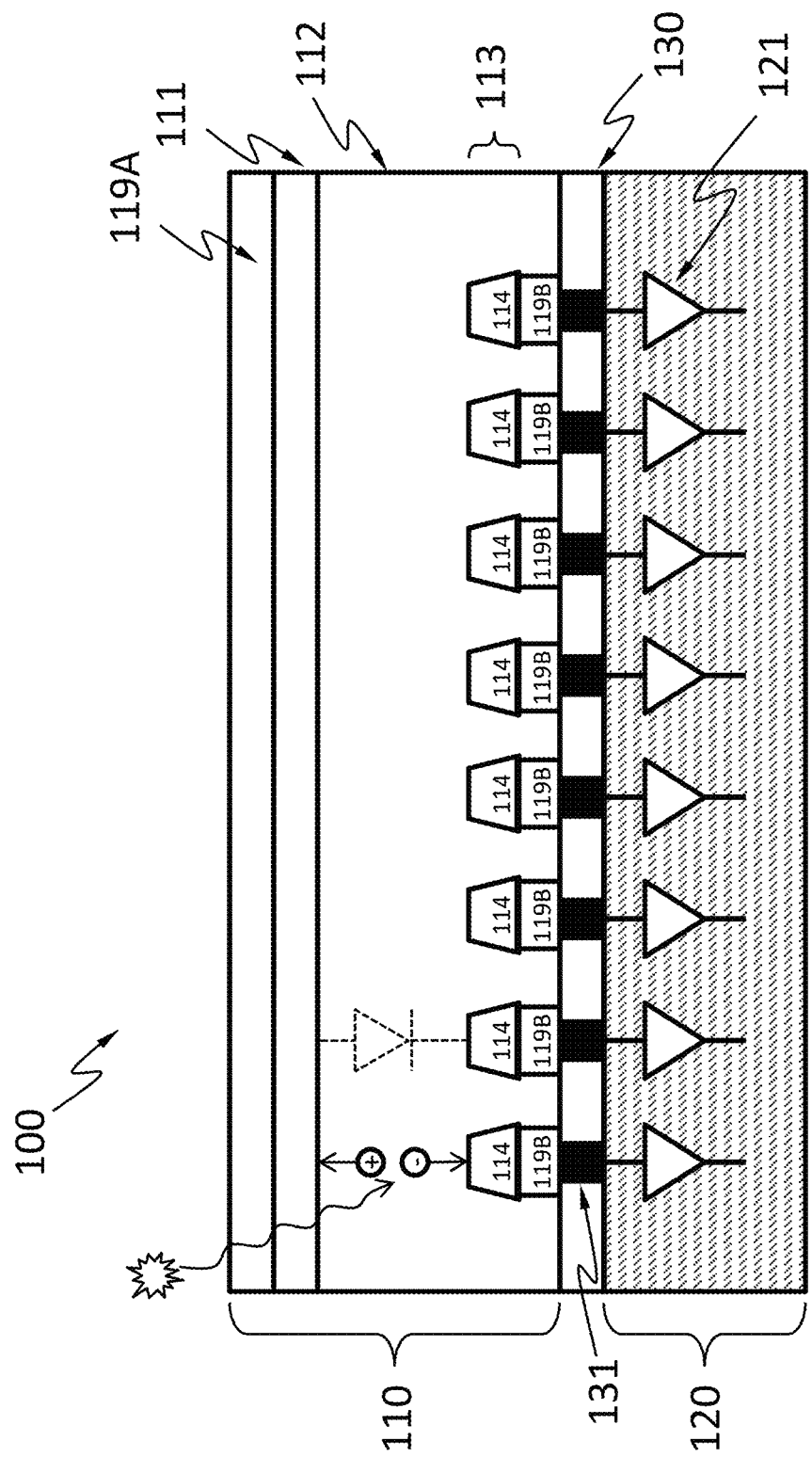
FIG. 2B schematically shows a detailed cross-sectional view of the photon detector, according to an embodiment.

As shown in a detailed cross-sectional view of the photon detector 100 in FIG. 2B, according to an embodiment, the photon absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 2B, each of the discrete regions 114 of the second doped region 113 forms a diode with the first doped region 111 and the optional intrinsic region 112. Namely, in the example in FIG. 2B, the photon absorption layer 110 has a plurality of diodes having the first doped region 111 as a shared electrode. The first doped region 111 may also have discrete portions.

When photons (e.g., photons of a reflected light pulse into the photon detector 100) hit the photon absorption layer 110 including diodes, the photons may be absorbed and generate one or more charge carriers by a number of mechanisms. The charge carriers may drift to the electrodes of one of the diodes under an electric field. The field may be an external electric field. The electrical contact 119B may include discrete portions each of which is in electrical contact with the discrete regions 114. The term "electrical contact" may be used interchangeably with the word "electrode." In an embodiment, the charge carriers may drift in directions such that the charge carriers generated by a single photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a photon incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a photon incident therein flow to the discrete region 114. Namely, less than 2%, less than 1%, less than 0.1%, or less than 0.01% of these charge carriers flow beyond the pixel.

Figure 2C:
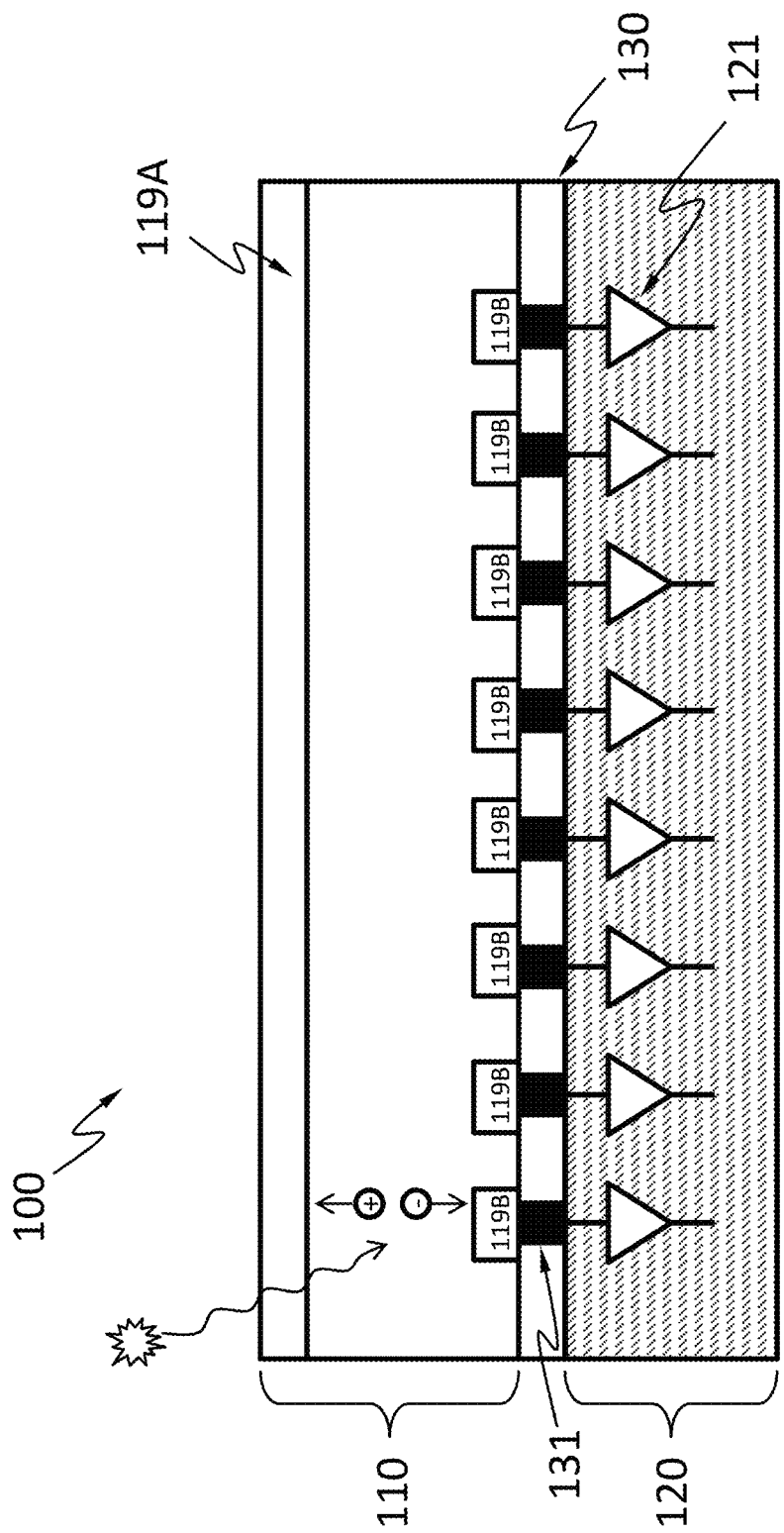
FIG. 2C schematically shows an alternative detailed cross-sectional view of the photon detector, according to an embodiment.

As shown in an alternative detailed cross-sectional view of the photon detector 100 in FIG. 2C, according to an embodiment, the photon absorption layer 110 may include a resistor of a semiconductor material such as, silicon, germanium, GaAs, CdTe, CdZnTe, or a combination thereof, but does not include a diode. The semiconductor may have a high mass attenuation coefficient for the photon of interest.

When photons (e.g., of a reflected light pulse into the photon detector 100) hit the photon absorption layer 110 including a resistor but not diodes, they may be absorbed and generate one or more charge carriers by a number of mechanisms. A photon may generate one or more charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a photon are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by a photon incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by a photon incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by the photons incident on the photon absorption layer 110. The electronic system 121 may include an analog circuitry such as a filter network, amplifiers, integrators, and comparators, or a digital circuitry such as a microprocessor, and memory. The electronic system 121 may include one or more ADCs. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the photon absorption layer 110. Other bonding techniques are possible to connect the electronic system 121 to the pixels without using vias.

Figure 3A:
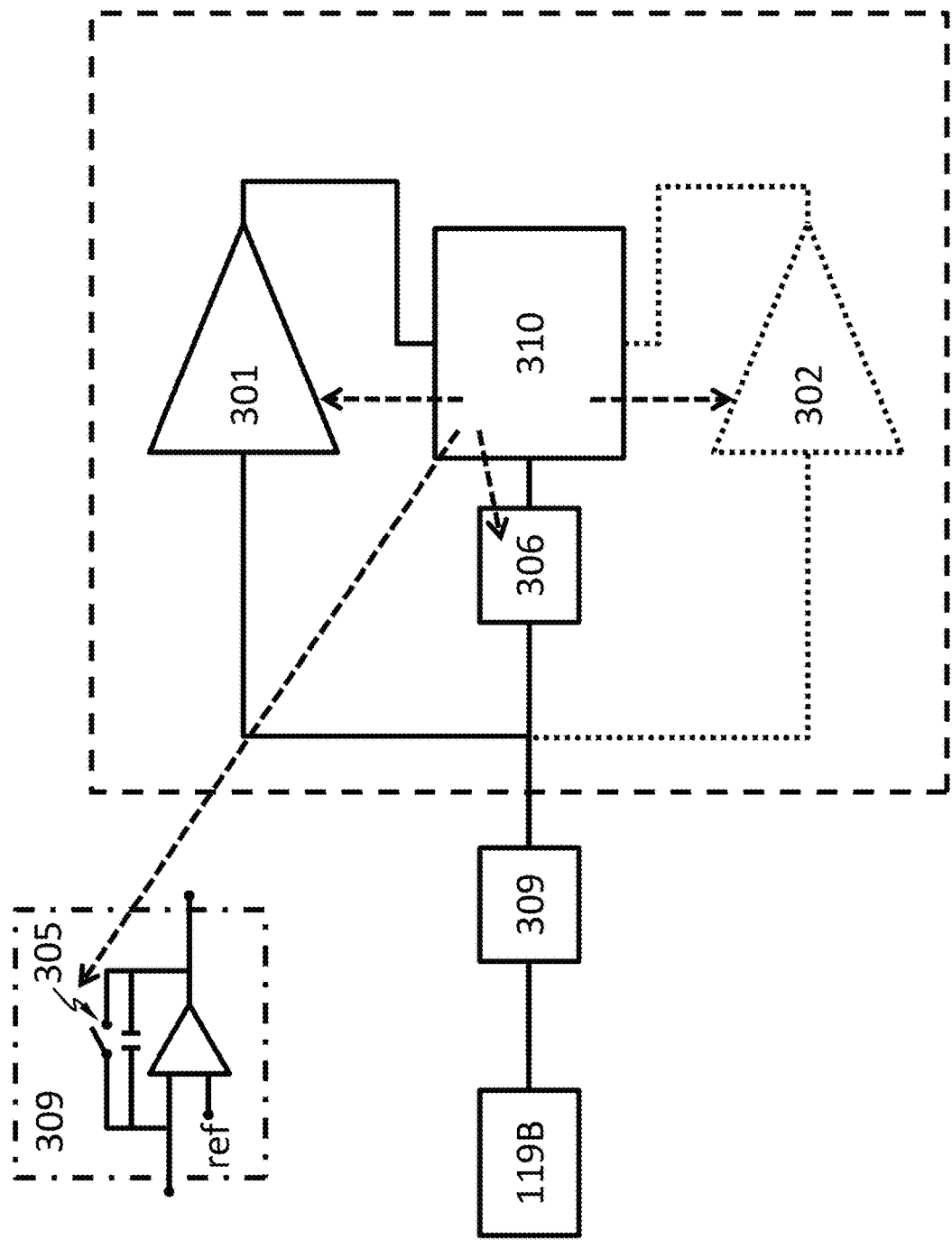

FIG. 3A and FIG. 3B each show a component diagram of the electronic system 121, according to an embodiment. The electronic system 121 may include a voltage comparator 301, a switch 305, a voltmeter 306, a controller 310, and optionally one or more additional voltage comparators 302.

The voltage comparator 301 is configured to compare the voltage of the electrode of a diode to one or more thresholds. The diode may be a diode formed by the first doped region 111, one of the discrete regions 114 of the second doped region 113, and the optional intrinsic region 112. Alternatively, the voltage comparator 301 is configured to compare the voltage of an electrical contact of a resistor (e.g., a discrete portion of electrical contact 119B) to one or more thresholds. The voltage comparator 301 may be configured to monitor the voltage directly, or calculate the voltage by integrating an electric current flowing through the diode or electrical contact over a period of time. The voltage comparator 301 may be controllably activated or deactivated by the controller 310. The voltage comparator 301 may be a continuous comparator. Namely, the voltage comparator 301 may be configured to be activated continuously, and monitor the voltage continuously. The voltage comparator 301 configured as a continuous comparator reduces the chance that the electronic system 121 misses signals generated by incident photons. The voltage comparator 301 configured as a continuous comparator is especially suitable when the incident photon flux is relatively high. The voltage comparator 301 may be a clocked comparator, which has the benefit of lower power consumption. The voltage comparator 301 configured as a clocked comparator may cause the electronic system 121 to miss signals generated by some incident photons. When the incident photon flux is low, the chance of missing an incident photon is low because the time interval between two successive photons is relatively long. Therefore, the voltage comparator 301 configured as a clocked comparator is especially suitable when the incident photon flux is relatively low.

The voltage comparator 301 may include one or more op-amps or any other suitable circuitry. The voltage comparator 301 may have a high speed to allow the electronic system 121 to operate under a high flux of incident photons. However, having a high speed is often at the cost of power consumption.

The electronic system 121 may include a capacitor module 309 electrically connected to the electrode or the electrical contact, wherein the capacitor module is configured to collect charge carriers from the electrode or the electrical contact. The capacitor module 309 can include a capacitor. In one embodiment, the capacitor may be in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode or the electrical contact accumulate on the capacitor over a period of time, after which, the capacitor voltage (i.e., the voltage across the two terminals of the capacitor) is sampled and then reset by a reset switch. The capacitor module can include a capacitor directly connected to the electrode or the electrical contact.

The controller 310 may be a hardware component such as a microcontroller and a microprocessor. In one embodiment, in response to a light pulse being emitted by a light source, the controller 310 may be configured to control the capacitor of the capacitor module 309 to start accumulating on the capacitor charge carriers generated from photons of a light pulse received by the photon absorption layer 110 (i.e., charging the capacitor with charge carriers generated from the photons in the photon absorption layer 110). For example, the controller 310 may control the capacitor to disconnect from a ground at the time that a light pulse is emitted from a light source, or alternatively, at some time (e.g., a configurable time determined or specified after a calibration) after the emission of such a light pulse. In one embodiment, the controller 310 may also be configured to control the light source. Moreover, in one embodiment, the voltage comparator 301 may be controllably activated (e.g., by the controller 310) when the capacitor starts being charged.

Thereafter, the controller 310 may be configured to record a first time t1 at which an absolute value of a voltage (e.g., a voltage across the capacitor) equals or exceeds an absolute value of a first threshold (e.g., the absolute value of the voltage increases from below the absolute value of the first threshold to a value equal to or above the absolute value of the first threshold). The absolute value is used here for the purpose of explanation because the voltage may be negative or positive, depending on whether the voltage of the cathode or the anode of the diode or which electrical contact is used. The time t1, for example, may be determined as the time when the voltage on the capacitor reaches the first threshold V1. In one embodiment, this time t1 may be counted by counting cycles of an oscillator.

A phrase such as "the absolute value of the voltage equals or exceeds an absolute value of a threshold" is intended to encompass that the value of the voltage equals or exceeds the value of the threshold, when the voltage and the threshold are positive, and that the additive inverse (i.e., negation) of the value of the voltage equals or exceeds the additive inverse (i.e., negation) of the value of the threshold, when the voltage and the threshold are negative. Determining whether "the absolute value of the voltage equals or exceeds an absolute value of a threshold" does not necessarily involve determining the absolute value of the voltage or the absolute value of the threshold because the signs (i.e., positive or negative) of the voltage and the threshold are usually known in a given system.

The controller 310 may be configured to determine whether that the absolute value of the voltage equals or exceeds an absolute value of a second threshold V2 before expiration of a time delay TD1 from the first time t1. Upon determining that the absolute value of the voltage equals or exceeds the absolute value of the second threshold V2 before expiration of the time delay TD1 from the first time t1, the controller 310 may record the time t2 at which the absolute value of the voltage equals or exceeds the absolute value of the second threshold V2 (e.g., the absolute value of the voltage increases from below the absolute value of the second threshold to a value equal to or above the absolute value of the second threshold). The time t2, for example, may be determined as the time when the voltage reaches the second threshold V2. In one embodiment, if the voltage does not reach V2 before the expiration of the time delay TD1, the voltage may be deemed noise and the voltage is reset (e.g., by connecting both terminals of the capacitor to a ground). In one embodiment, the time delay TD1 may be specified after a calibration.

After recording the second time t2, the controller 310 may continue to record a third time t3 at which the absolute value of the voltage equals or exceeds an absolute value of a third threshold (e.g., the absolute value of the voltage increases from below the absolute value of the third threshold to a value equal to or above the absolute value of the third threshold). The time t3, for example, may be determined as the time when the voltage reaches the third threshold V3. The controller 310 may be configured to record one or more times ti at which the absolute value of the voltage equals or exceeds absolute values of one or more thresholds, respectively. Thereafter, the controller 310 may be configured to record the voltage Vs as the "stable value" of the voltage after the voltage is stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns. The controller 310 may be configured to determine a time at which photons of a pulse of light arrive at the photon detector, where charge carriers generated from those photons cause the voltage being processed by the controller 310 based on V3, t3 and Vs. In one embodiment, the voltage comparator 301 may be controllably deactivated (e.g., by the controller 310) when it is determined that the voltage is stable.

In one embodiment, the controller 310 may be configured to keep deactivated any circuits the operation of the voltage comparator 301 does not require, before the time at which the voltage comparator 301 determines that the absolute value of the voltage equals or exceeds the absolute value of the second threshold. Moreover, in one embodiment, the controller 310 may start a time delay after a time at which the absolute value of the voltage equals or exceeds an absolute value of a threshold and record the voltage after the expiration of the time delay as the voltage Vs. That is, the recorded voltage Vs may not be that real stable voltage because time delay may expire before or after the voltage really becomes stable, i.e., the rate of change of the voltage is substantially zero.

The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state.

In one embodiment, the controller 310 may be configured to cause the voltmeter 306 to measure the voltage Vs, for example, continue measuring the voltage and determine when the voltage becomes stable, or take one measurement upon expiration of a time delay. The controller 310 may be configured to reset the voltage (e.g., by connecting the electrode or the electrical contact to an electrical ground). In an embodiment, the electrode or the electrical contact is connected to an electrical ground after obtaining the voltage Vs. In an embodiment, the electrode or the electrical contact is connected to an electrical ground for a finite reset time period. The controller 310 may connect the electrode or the electrical contact to the electrical ground by controlling the switch 305. The switch may be a transistor such as a field-effect transistor (FET).

In an embodiment, the electronic system 121 has no analog filter network (e.g., a RC network). In an embodiment, the electronic system 121 has no analog circuitry. Furthermore, in an embodiment, the voltmeter 306 may feed the voltage it measures to the controller 310 as an analog or digital signal.

Figure 4:
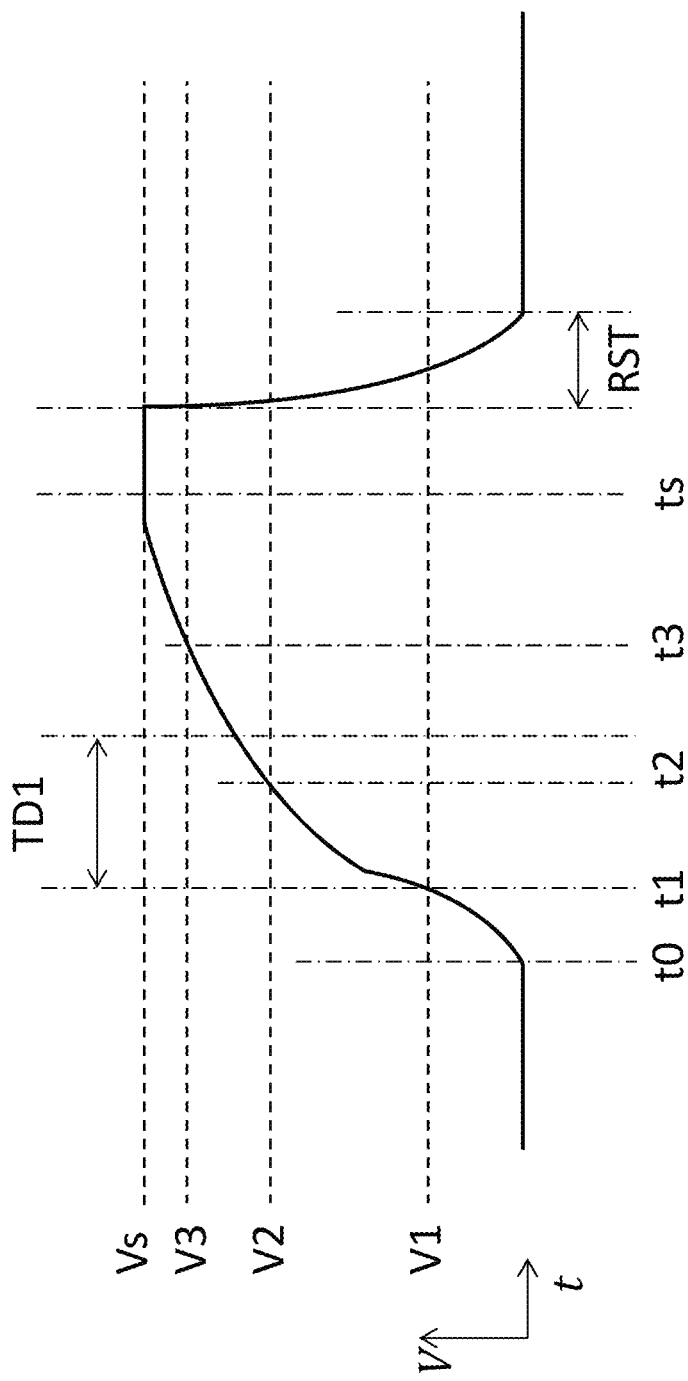
FIG. 4 schematically shows a temporal change of the voltage of the electrode of a diode or the electrical contact of a resistor in the photon absorption layer of the photon detector, caused by charge carriers generated by one or more photons incident on the diode or the resistor, according to an embodiment.

FIG. 4 schematically shows a temporal change of the voltage of the electrode or the electrical contact or the voltage across the capacitor of the capacitor module 309 connected to the electrode or electrical contact, caused by charge carriers generated by photons (e.g., of a reflected light pulse) incident on the diode or the resistor, according to an embodiment. The voltage may be an integral of the electric current with respect to time. At a time t0, charge carriers may start charging the capacitor, and the absolute value of the voltage across the capacitor may start to increase. In one embodiment, photons of a reflected light pulse may enter the diode or the resister and the charge carriers may be generated in the diode or the resistor. In one embodiment, the time t0 may be the time at which the light pulse is emitted by a light source. In another embodiment, the time t0 may be a time after a delay from the time at which the light pulse is emitted by a light source.

At time t1, the voltage comparator 301 may determine that the absolute value of the voltage equals or exceeds the absolute value of the first threshold V1, and the controller 310 may record the time t1 at which the absolute value of the voltage equals or exceeds the absolute value of the first threshold V1. At a later time, but within a time delay TD1, the voltage comparator 301 may determine that the absolute value of the voltage equals or exceeds the absolute value of the second threshold V2, and the controller 310 may record the time t2 at which the absolute value of the voltage equals or exceeds the absolute value of the second threshold V2. In one embodiment, if the voltage does not reach V2 before the time delay TD1 expires, the voltage may be deemed noise and the voltage may be reset. Without resetting the voltage (e.g., grounding both terminals of the capacitor), the absolute value of the voltage may continue to increase. The voltage comparator 301 may determine that the absolute value of the voltage equals or exceeds the absolute value of the third threshold V3, and the controller 310 may record the time t3 at which the absolute value of the voltage equals or exceeds the absolute value of the third threshold V3. At time ts, the voltage may be deemed stable and the stable value Vs of the voltage may be recorded.

Figure 5:
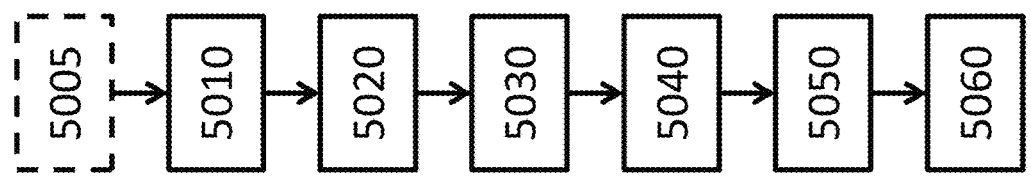
FIG. 5 shows a flow chart for a method for determining a time at which a light pulse arrives at the photon detector, according to an embodiment.

FIG. 5 shows a flow chart for a method for determining a time at which photons of a reflected light pulse arrive at the photon detector 100, according to an embodiment. In procedure 5010, the photons are received by the photon detector 100 and charge carriers are generated from the photons. For example, the photons may be absorbed by the photon absorption layer 110 and charge carriers may be generated from the photons in the photon absorption layer 110. In procedure 5020, a capacitor (e.g., the capacitor in the capacitor module 309) is charged by the charge carriers. In procedure 5030, a first time (e.g., t1) at which an absolute value of a voltage across the capacitor equals or exceeds an absolute value of a first threshold (e.g., V1) is obtained. In procedure 5030, upon determining that the absolute value of the voltage across the capacitor equals or exceeds an absolute value of a second threshold (e.g., V2) before expiration of a time delay (e.g., TD1) from the first time, a second time (e.g., t2) at which the absolute value of the voltage across the capacitor equals or exceeds the absolute value of the second threshold is obtained. In procedure 5040, a third time (e.g., t2) at which the absolute value of the voltage across the capacitor equals or exceeds an absolute value of a third threshold (e.g., V3) is obtained. Additional times at which the absolute value of the voltage across the capacitor equals or exceeds the absolute values of additional thresholds, respectively, may be obtained. In procedure 5050, a stable value (e.g., Vs) of the voltage across the capacitor when the voltage across the capacitor is stable is obtained. The voltage across the capacitor may be reset after obtaining the stable value of the voltage across the capacitor. In procedure 5060, a time at which the photons arrive at the photon detector 100 is determined, based on the third time, the third threshold and the stable value of the voltage across the capacitor. In an embodiment, upon determining that the absolute value of the voltage across the capacitor is less than the absolute value of the second threshold after expiration of the time delay, the voltage across the capacitor may be reset. The method may further include, in procedure 5005, emitting a light pulse. The capacitor may be allowed to be charged upon emitting the light pulse, or only after some time from the emission of the light pulse. The photons received by the photon detector 100 may be among the photons of the light pulse reflected by an object. The time at which the photons arrive at the photon detector 100 may be used to determine a distance of the object to the photon detector 100.

According to an embodiment, the photon detector 100 may use delta-sigma (sigma-delta, $\Delta\Sigma$ or $\Sigma\Delta$) modulation. The first step in a delta-sigma modulation is delta modulation. In delta modulation the change in the signal (its delta) is encoded, rather than the absolute value. The result is a stream of pulses, as opposed to a stream of numbers. The digital output (i.e., the pulses) is passed through a 1-bit DAC and the resulting analog signal (sigma) is added to the input signal of the ADC. During the integration of the analog signal, when the analog signal reaches the delta, a counter is increased by one and the delta is deducted from the analog signal. At the end of the integration, the registered value of the counter is the digital signal and the remaining analog signal smaller than the delta is the residue analog signal.

Figure 6:
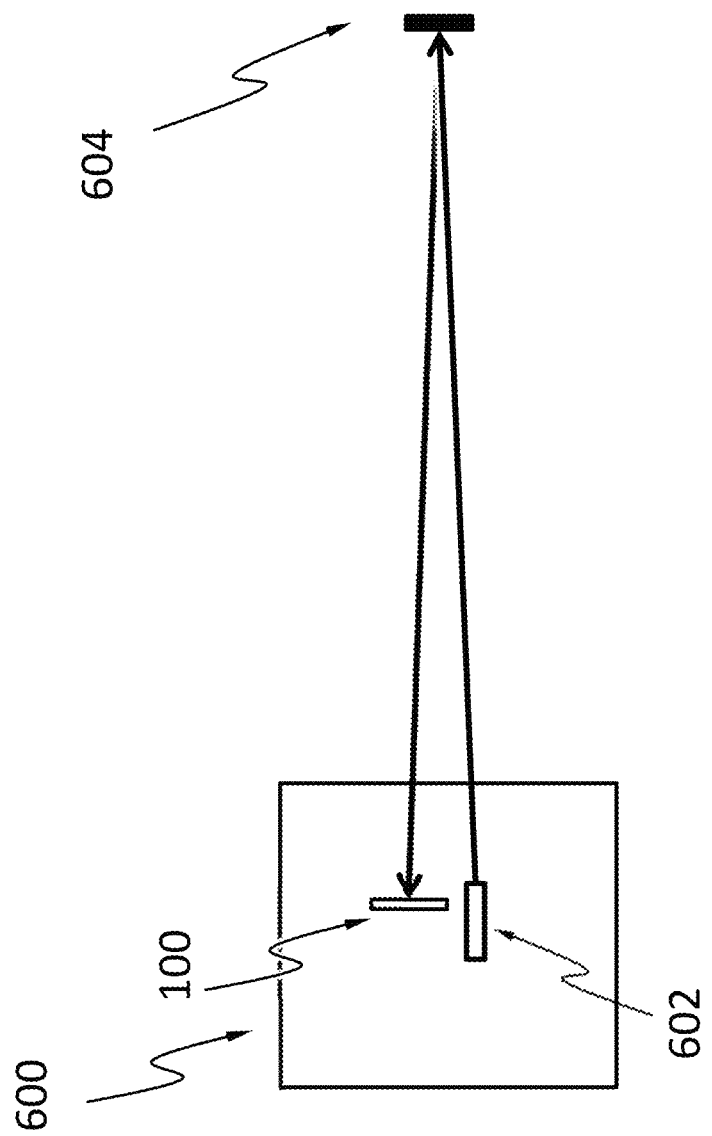
FIG. 6 schematically shows a system comprising the photon detector described herein.

FIG. 6 schematically shows a LIDAR system 600 comprising the photon detector 100 described herein, according to an embodiment. The LIDAR system 600 may be mounted on a vehicle (e.g., automobile or drone) and used as an on-vehicle LIDAR. The LIDAR system 600 may comprise a light source 602 configured to emit a light pulse. The light source 602 may be a laser source. The light source 602 may be configured to generate scanning light pulses and the photon detector 100 may be used detect reflection of the light pulses by an object (e.g., a building, a person, an obstacle, or landscape) in a scene 604. In one embodiment, a characteristic (e.g., the distance, shape, or motion) of the object may be obtained based on the times at which photons reflected by the object arrive at the photon detector 100. In one embodiment, the LIDAR system 600 may have one or more filters upstream to the photon detector 100 to diminish the impact of ambient light. The LIDAR system 600 may be configured to perform the method in FIG. 5 or otherwise described herein.

In some embodiments, the photon absorption layer 110 may include avalanche photodiodes (APDs). The electronic system 121 described above and the methods for determining a time at which photons arrive at the photon detector may still apply to a photon detector with APDs.

An avalanche photodiode (APD) is a photodiode that uses the avalanche effect to generate an electric current upon exposure to light. The avalanche effect is a process where free charge carriers in a material are subjected to strong acceleration by an electric field and subsequently collide with other atoms of the material, thereby ionizing them (impact ionization) and releasing additional charge carriers which accelerate and collide with further atoms, releasing more charge carriers—a chain reaction. Impact ionization is a process in a material by which one energetic charge carrier can lose energy by the creation of other charge carriers. For example, in semiconductors, an electron (or hole) with enough kinetic energy can knock a bound electron out of its bound state (in the valence band) and promote it to a state in the conduction band, creating an electron-hole pair. An example of the photon detector 100 comprising APDs may be the photon detector 800 as described herein.

An APD may work in the Geiger mode or the linear mode. When the APD works in the Geiger mode, it may be called a single-photon avalanche diode (SPAD) (also known as a Geiger-mode APD or G-APD). A SPAD is an APD working under a reverse bias above the breakdown voltage. Here the word "above" means that absolute value of the reverse bias is greater than the absolute value of the breakdown voltage. A SPAD may be used to detect low intensity light (e.g., down to a single photon) and to signal the arrival times of the photons with a jitter of a few tens of picoseconds. A SPAD may be in a form of a p-n junction under a reverse bias (i.e., the p-type region of the p-n junction is biased at a lower electric potential than the n-type region) above the breakdown voltage of the p-n junction. The breakdown voltage of a p-n junction is a reverse bias, above which exponential increase in the electric current in the p-n junction occurs. An APD working at a reverse bias below the breakdown voltage is operating in the linear mode because the electric current in the APD is proportional to the intensity of the light incident on the APD.

Figure 7C:
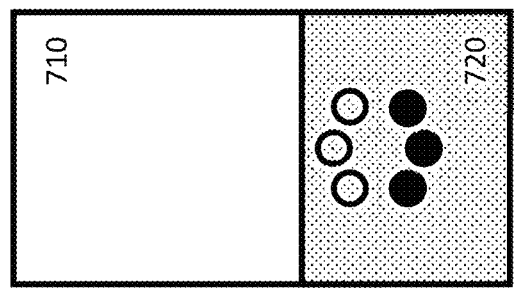
FIG. 7A, FIG. 7B and FIG. 7C schematically show the operation of an APD, according to an embodiment.
Figure 7B:
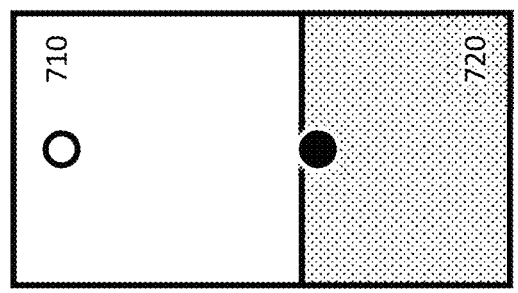
Figure 7A:
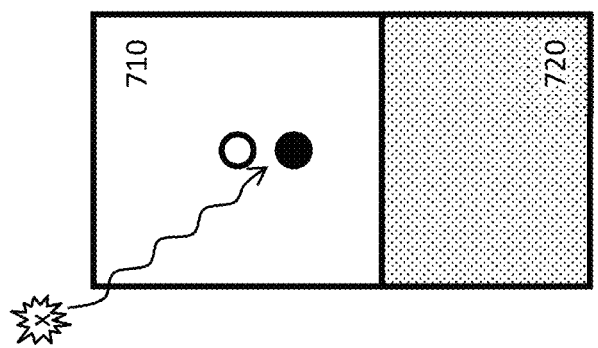

FIG. 7A, FIG. 7B and FIG. 7C schematically show the operation of an APD, according to an embodiment. FIG. 7A shows that when a photon (e.g., an X-ray photon) is absorbed by an absorption region 710, multiple (e.g., 100 to 10000 for an X-ray photon) electron-hole pairs may be generated. The absorption region 710 has a sufficient thickness and thus a sufficient absorptance (e.g., >80% or >90%) for the incident photon. For soft X-ray photons, the absorption region 710 may be a silicon layer with a thickness of 10 microns or above. The electric field in the absorption region 710 is not high enough to cause avalanche effect in the absorption region 710. FIG. 7B shows that the electrons and hole drift in opposite directions in the absorption region 710. FIG. 7C shows that avalanche effect occurs in an amplification region 720 when the electrons (or the holes) enter that amplification region 720, thereby generating more electrons and holes. The electric field in the amplification region 720 is high enough to cause an avalanche of charge carriers entering the amplification region 720 but not too high to make the avalanche effect self-sustaining. A self-sustaining avalanche is an avalanche that persists after the external triggers disappear, such as photons incident on the APD or charge carriers drifted into the APD. The electric field in the amplification region 720 may be a result of a doping profile in the amplification region 720. For example, the amplification region 720 may include a p-n junction or a heterojunction that has an electric field in its depletion zone. The threshold electric field for the avalanche effect (i.e., the electric field above which the avalanche effect occurs and below which the avalanche effect does not occur) is a property of the material of the amplification region 720. The amplification region 720 may be on one or two opposite sides of the absorption region 710.

Figure 8A:
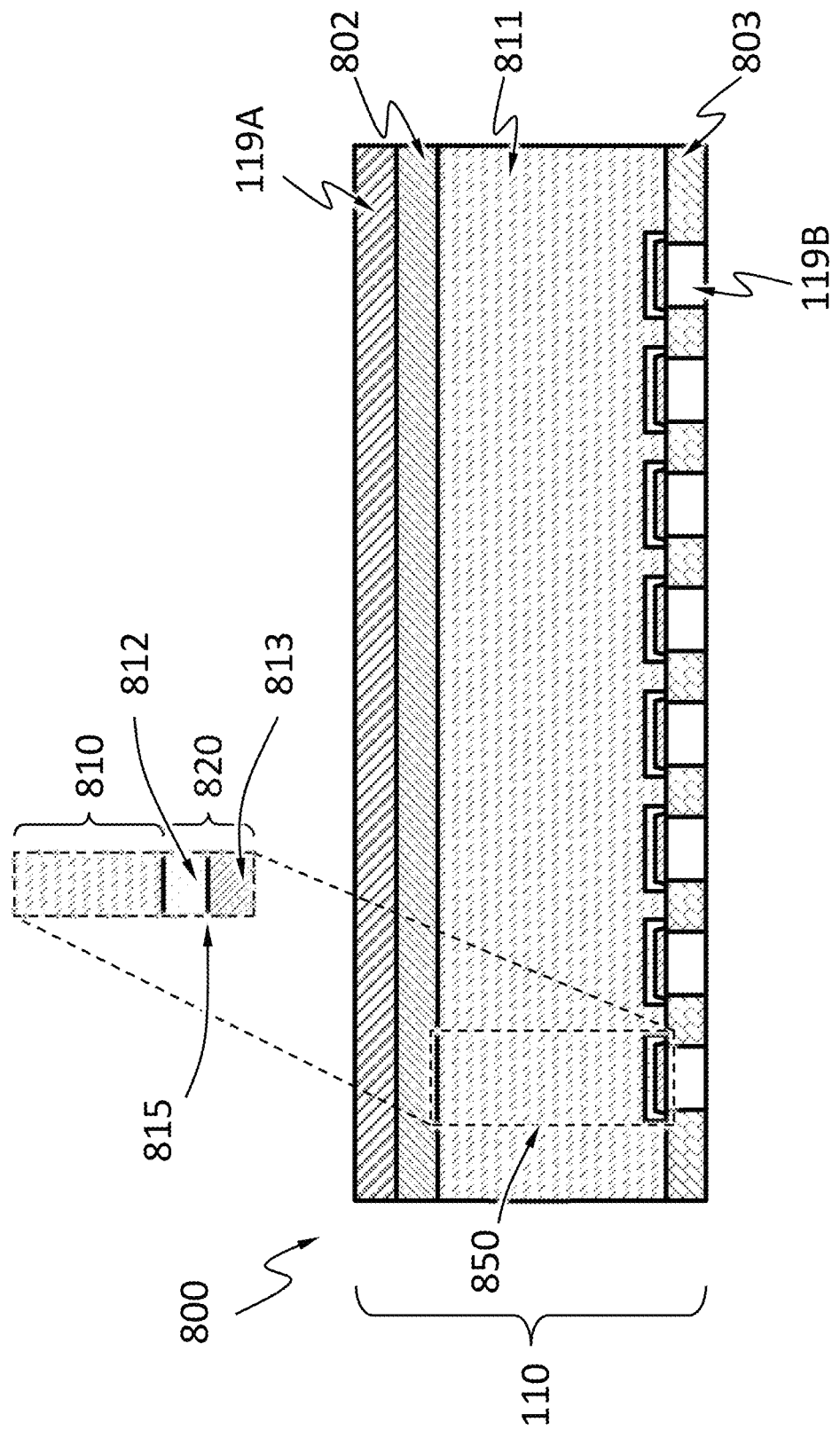
FIG. 8A schematically shows a cross section of a photon detector based on an array of APDs.

FIG. 8A schematically shows a cross section of a photon detector 800 based on an array of APDs 850. Each of the APDs 850 may have an absorption region 810 and an amplification region 820 as the examples of 710 and 720 shown in FIG. 7A, FIG. 7B and FIG. 7C. At least some, or all, of the APDs 850 in the photon detector 800 may have their absorption regions 810 joined together. Namely, the photon detector 800 may have joined absorption regions 810 in a form of an absorption layer 811 that is shared among at least some or all of the APDs 850. The amplification regions 820 of the APDs 850 are discrete regions. Namely the amplification regions 820 of the APDs 850 are not joined together. In an embodiment, the absorption layer 811 may be in form of a semiconductor wafer such as a silicon wafer. The absorption regions 810 may be an intrinsic semiconductor or very lightly doped semiconductor (e.g., $<10^{12}$ dopants/cm$^3$, $<10^{11}$ dopants/cm$^3$, $<10^{10}$ dopants/cm$^3$, $<10^{9}$ dopants/cm$^3$), with a sufficient thickness and thus a sufficient absorptance (e.g., >80% or >90%) for incident photons of interest (e.g., X-ray photons). The amplification regions 820 may have a junction 815 formed by at least two layers 812 and 813. The junction 815 may be a heterojunction of a p-n junction. In an embodiment, the layer 812 is a p-type semiconductor (e.g., silicon) and the layer 813 is a heavily doped n-type layer (e.g., silicon). The phrase "heavily doped" is not a term of degree. A heavily doped semiconductor has its electrical conductivity comparable to metals and exhibits essentially linear positive thermal coefficient. In a heavily doped semiconductor, the dopant energy levels are merged into an energy band. A heavily doped semiconductor is also called degenerate semiconductor. The layer 812 may have a doping level of $10^{13}$ to $10^{17}$ dopants/cm$^3$. The layer 813 may have a doping level of $10^{18}$ dopants/cm$^3$ or above. The layers 812 and 813 may be formed by epitaxy growth, dopant implantation or dopant diffusion. The band structures and doping levels of the layers 812 and 813 can be selected such that the depletion zone electric field of the junction 815 is greater than the threshold electric field for the avalanche effect for electrons (or for holes) in the materials of the layers 812 and 813, but is not too high to cause self-sustaining avalanche. Namely, the depletion zone electric field of the junction 815 should cause avalanche when there are incident photons in the absorption region 810 but the avalanche should cease without further incident photons in the absorption region 810.

The photon detector 800 may further include electrical contacts 119B respectively in electrical contact with the layer 813 of the APDs 850. The electrical contacts 119B are configured to collect electric current flowing through the APDs 850.

The photon detector 800 may further include a passivation material 803 configured to passivate surfaces of the absorption regions 810 and the layer 813 of the APDs 850 to reduce recombination at these surfaces.

The photon detector 800 may further include a heavily doped layer 802 disposed on the absorption regions 810 opposite to the amplification region 820, and an electrical contact 119A on the heavily doped layer 802. The electrical contact 119A of at least some or all of the APDs 850 may be joined together. The heavily doped layer 802 of at least some or all of the APDs 850 may be joined together.

When a photon enters the photon detector 800, it may be absorbed by the absorption region 810 of one of the APDs 850, and charge carriers may be generated in the absorption region 810 as a result. One type (electrons or holes) of the charge carriers drift toward the amplification region 820 of that one APD. When the charge carriers enter the amplification region 820, the avalanche effect occurs and causes amplification of the charge carriers. The amplified charge carriers can be collected through the electrical contact 119B of that one APD, as an electric current. When that one APD is in the linear mode, the electric current is proportional to the number of incident photons in the absorption region 810 per unit time (i.e., proportional to the light intensity at that one APD). The electric currents at the APDs may be compiled to represent a spatial intensity distribution of light, i.e., an image. The amplified charge carriers may alternatively be collected through the electrical contact 119B of that one APD, and the number of photons may be determined from the charge carriers (e.g., by using the temporal characteristics of the electric current).

Figure 8B:
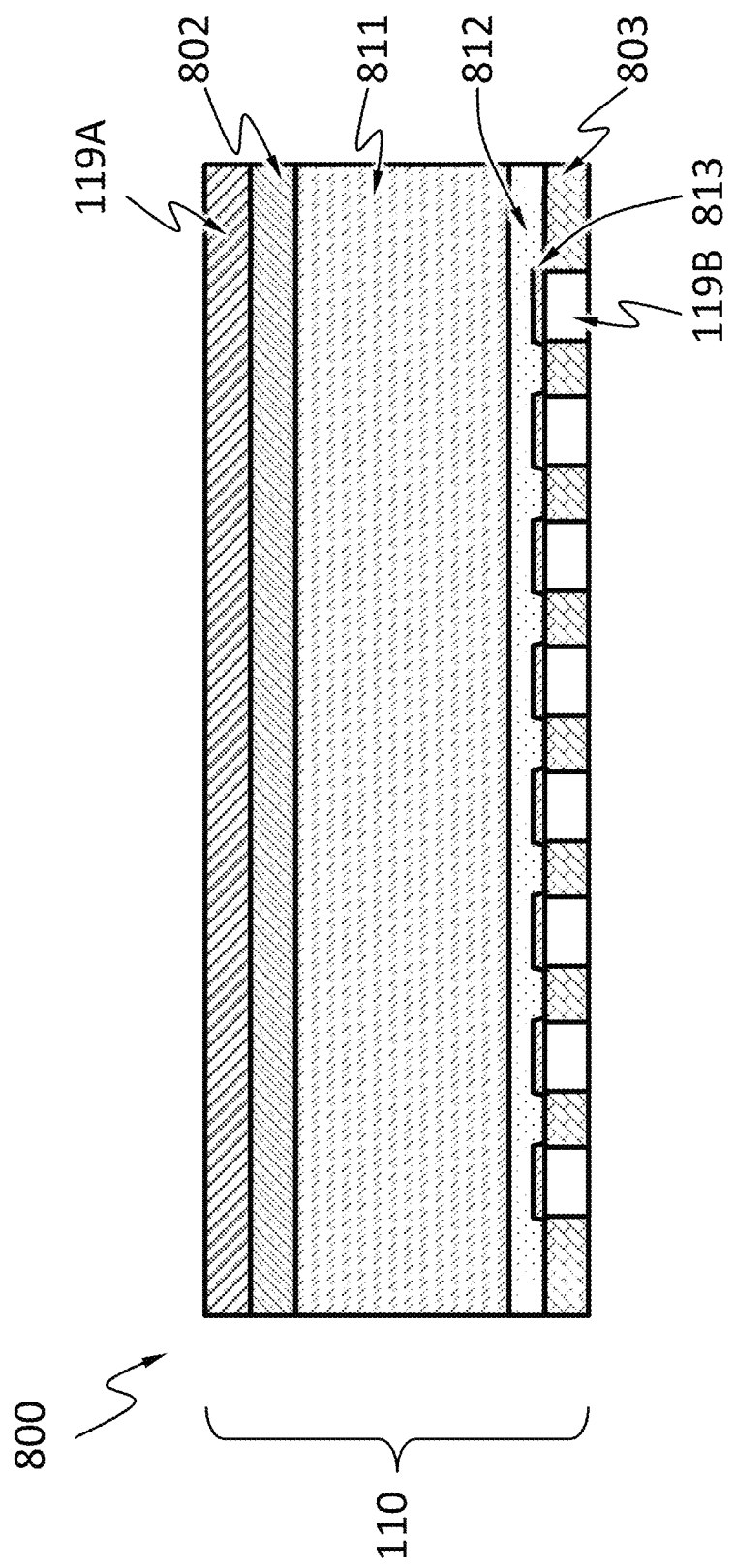
FIG. 8B shows a variant of the image sensor of FIG. 8A.
Figure 8C:
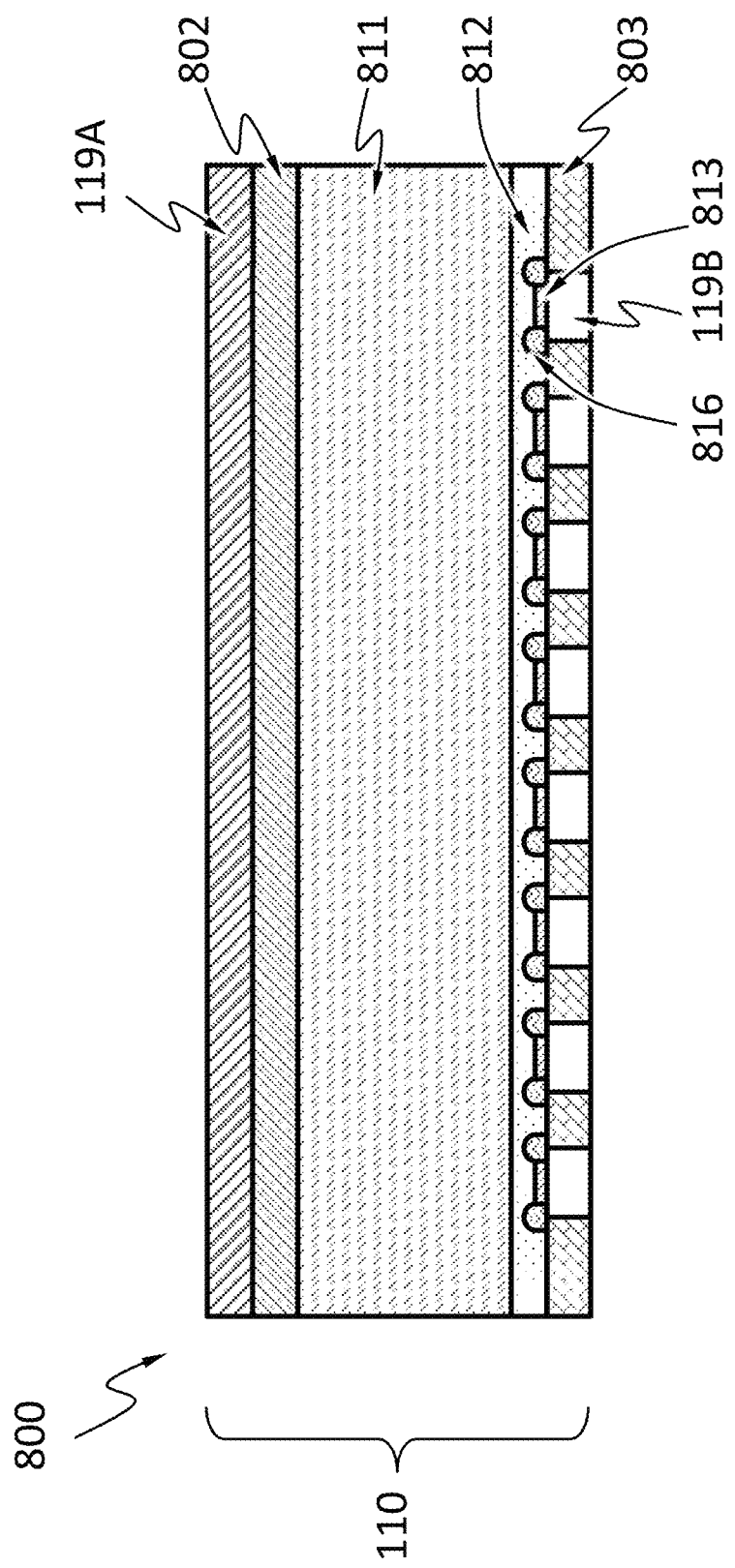
FIG. 8C shows a variant of the image sensor of FIG. 8A.

The junctions 815 of the APDs 850 should be discrete, i.e., the junction 815 of one of the APDs should not be joined with the junction 815 of another one of the APDs. Charge carriers amplified at one of the junctions 815 of the APDs 850 should not be shared with another of the junctions 815. The junction 815 of one of the APDs may be separated from the junction 815 of the neighboring APDs by the material of the absorption region wrapping around the junction, by the material of the layer 812 or 813 wrapping around the junction, by an insulator material wrapping around the junction, or by a guard ring of a doped semiconductor. As shown in FIG. 8A, the layer 812 of each of the APDs 850 may be discrete, i.e., not joined with the layer 812 of another one of the APDs; the layer 813 of each of the APDs 850 may be discrete, i.e., not joined with the layer 813 of another one of the APDs. FIG. 8B shows a variant of the photon detector 800, where the layers 812 of some or all of the APDs are joined together. FIG. 8C shows a variant of the photon detector 800, where the junction 815 is surrounded by a guard ring 816. The guard ring 816 may be an insulator material or a doped semiconductor. For example, when the layer 813 is heavily doped n-type semiconductor, the guard ring 816 may be n-type semiconductor of the same material as the layer 813 but not heavily doped. The guard ring 816 may be present in the photon detector 800 shown in FIG. 8A or FIG. 8B. FIG. 8D shows a variant of the photon detector 800, where the junction 815 has an intrinsic semiconductor layer 817 sandwiched between the layer 812 and 813. The intrinsic semiconductor layer 817 in each of the APDs 850 may be discrete, i.e., not joined with other intrinsic semiconductor layer 817 of another APD. The intrinsic semiconductor layers 817 of some or all of the APDs 850 may be joined together.

The photon detector 800 may be an embodiment of the photon detector 100. Although not shown, an embodiment of the photon detector 800 may also comprise the electronic system 121 as described here (e.g., electrically connected to the amplification region), and may be used in the system 600 as the photon detector 100.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
    receiving photons using a photon detector including a capacitor;
    charging the capacitor with charge carriers generated from the photons;
    obtaining a first time at which an absolute value of a voltage across the capacitor equals or exceeds an absolute value of a first threshold;
    upon determining that the absolute value of the voltage across the capacitor equals or exceeds an absolute value of a second threshold before expiration of a time delay from the first time, obtaining a second time at which the absolute value of the voltage across the capacitor equals or exceeds the absolute value of the second threshold;
    obtaining a third time at which the absolute value of the voltage across the capacitor equals or exceeds an absolute value of a third threshold;
    obtaining a stable value of the voltage across the capacitor when the voltage across the capacitor is stable;
    determining a time at which the photons arrive at the photon detector, based on the third time, the third threshold and the stable value of the voltage across the capacitor.

2. The method of claim 1, further comprising resetting the voltage across the capacitor after obtaining the stable value of the voltage across the capacitor.

3. The method of claim 1, further comprising: upon determining that the absolute value of the voltage across the capacitor is less than the absolute value of the second threshold after expiration of the time delay, resetting the voltage across the capacitor.

4. The method of claim 1, further comprising emitting a light pulse.

5. The method of claim 4, further comprising allowing the capacitor to be charged upon emitting the light pulse.

6. The method of claim 4, wherein the photons received by the photon detector are of the light pulse reflected by an object.

7. The method of claim 6, further comprising determining a distance of the object to the photon detector based on the time at which the photons arrive at the photon detector.

8. A photon detector, comprising:
    a photon absorption layer comprising an electrode, the photon absorption layer configured to receive photons and to generate charge carriers from the photons;
    a capacitor electrically connected to the electrode and configured to be charged by the charge carriers;
    a controller;
    wherein the controller is configured:
        to obtain a first time at which an absolute value of a voltage across the capacitor equals or exceeds an absolute value of a first threshold;
        upon determining that the absolute value of the voltage across the capacitor equals or exceeds an absolute value of a second threshold before expiration of a time delay from the first time, to obtain a second time at which the absolute value of the voltage across the capacitor equals or exceeds the absolute value of the second threshold;
        to obtain a third time at which the absolute value of the voltage across the capacitor equals or exceeds an absolute value of a third threshold;
        to obtain a stable value of the voltage across the capacitor when the voltage across the capacitor is stable; and
        to determine a time at which the photons arrive at the photon detector, based on the third time, the third threshold and the stable value of the voltage across the capacitor.

9. The photon detector of claim 8, wherein the controller is configured to reset the voltage across the capacitor after obtaining the stable value of the voltage across the capacitor.

10. The photon detector of claim 8, wherein the controller is configured to reset the voltage across the capacitor upon determining that the absolute value of the voltage across the capacitor is less than the absolute value of the second threshold after expiration of the time delay.

11. The photon detector of claim 8, wherein the photon absorption layer comprises a diode.

12. The photon detector of claim 8, wherein the photon absorption layer comprises a resistor.

13. The photon detector of claim 8, wherein the photon absorption layer comprises an amplification region comprising a junction with an electric field in the junction; wherein the electric field is at a sufficient strength to cause an avalanche of charge carriers in the amplification region.

14. The photon detector of claim 8, wherein the photon absorption layer comprises silicon, germanium, GaAs, CdTe, CdZnTe, or a combination thereof.

15. The photon detector of claim 8, further comprising a voltmeter configured to measure the stable value of the voltage across the capacitor.

16. The photon detector of claim 8, further comprises an array of pixels.

17. The photon detector of claim 8, wherein the photons are reflected by an object toward the photon detector, wherein the controller is configured to determine a distance of the object to the photon detector based on the time at which the photons arrive at the photon detector.

18. A LIDAR system comprising the photon detector of claim 8 and a light source configured to emit a light pulse.

* * * * *